(12) United States Patent
Mulkens et al.

(10) Patent No.: US 9,330,912 B2
(45) Date of Patent: *May 3, 2016

(54) LITHOGRAPHIC APPARATUS, FLUID COMBINING UNIT AND DEVICE MANUFACTURING METHOD

(75) Inventors: Johannes Catharinus Hubertus Mulkens, Waalre (NL); Matthew Lipson, Stamford, CT (US); Harry Sewell, Ridgefield, CT (US); Louis John Markoya, Sandy Hook, CT (US)

(73) Assignees: ASML NETHERLANDS B.V., Veldhoven (NL); ASML HOLDING N.V., Veldhoven (NL)

( * ) Notice: Subject to any disclaimer, the term of this patent is extended or adjusted under 35 U.S.C. 154(b) by 387 days.

This patent is subject to a terminal disclaimer.

(21) Appl. No.: 13/238,941

(22) Filed: Sep. 21, 2011

(65) Prior Publication Data

US 2012/0013866 A1  Jan. 19, 2012

Related U.S. Application Data

(63) Continuation of application No. 11/603,255, filed on Nov. 22, 2006, now Pat. No. 8,045,135.

(51) Int. Cl.
*G03B 27/52* (2006.01)
*G03B 27/42* (2006.01)
*H01L 21/027* (2006.01)
*G03F 7/20* (2006.01)

(52) U.S. Cl.
CPC ........ *H01L 21/0274* (2013.01); *G03F 7/70341* (2013.01)

(58) Field of Classification Search
CPC ................. G03F 7/70341; H01L 21/0274
USPC ................................................ 355/53, 30
See application file for complete search history.

(56) References Cited

U.S. PATENT DOCUMENTS

| | | | |
|---|---|---|---|
| 3,573,975 A | 4/1971 | Dhaka et al. | 117/212 |
| 3,648,587 A | 3/1972 | Stevens | 95/44 |
| 4,346,164 A | 8/1982 | Tabarelli et al. | 430/311 |
| 4,390,273 A | 6/1983 | Loebach et al. | 355/125 |
| 4,396,705 A | 8/1983 | Akeyama et al. | 430/326 |
| 4,405,701 A | 9/1983 | Banks et al. | 430/5 |
| 4,480,910 A | 11/1984 | Takanashi et al. | 355/30 |

(Continued)

FOREIGN PATENT DOCUMENTS

| | | |
|---|---|---|
| DE | 206 607 | 2/1984 |
| DE | 221 563 | 4/1985 |

(Continued)

OTHER PUBLICATIONS

M. Switkes et al., "Immersion Lithography at 157 nm", MIT Lincoln Lab, Orlando 1-2001, Dec. 17, 2001.

(Continued)

*Primary Examiner* — Deoram Persaud
(74) *Attorney, Agent, or Firm* — Pillsbury Winthrop Shaw Pittman LLP (57) ABSTRACT

A system for tuning the refractive index of immersion liquid in an immersion lithographic apparatus is disclosed. Two or more immersion liquids of different refractive index are mixed together in order to achieve a desired refractive index. Further, the fluids may be conditioned and treated to maintain optical characteristics.

19 Claims, 5 Drawing Sheets

(56) References Cited

U.S. PATENT DOCUMENTS

| | | | |
|---|---|---|---|
| 4,509,852 A | 4/1985 | Tabarelli et al. | |
| 5,040,020 A | 8/1991 | Rauschenbach et al. | 355/53 |
| 5,121,256 A | 6/1992 | Corle et al. | 359/664 |
| 5,610,683 A | 3/1997 | Takahashi | 355/53 |
| 5,715,039 A | 2/1998 | Fukuda et al. | 355/53 |
| 5,825,043 A | 10/1998 | Suwa | 250/548 |
| 5,900,354 A | 5/1999 | Batchelder | 430/395 |
| 6,191,429 B1 | 2/2001 | Suwa | 250/548 |
| 6,236,634 B1 | 5/2001 | Lee et al. | 369/112 |
| 6,600,547 B2 | 7/2003 | Watson et al. | 355/30 |
| 6,603,130 B1 | 8/2003 | Bisschops et al. | 250/492.1 |
| 6,844,206 B1 * | 1/2005 | Phan et al. | 438/7 |
| 6,999,254 B1 | 2/2006 | Phan et al. | |
| 7,065,427 B1 | 6/2006 | Dakshina-Murthy et al. | |
| 7,224,435 B2 | 5/2007 | Sogard | 355/53 |
| 2002/0020821 A1 | 2/2002 | Van Santen et al. | 250/492 |
| 2002/0163629 A1 | 11/2002 | Switkes et al. | 355/53 |
| 2003/0123040 A1 | 7/2003 | Almogy | 355/69 |
| 2004/0000627 A1 | 1/2004 | Schuster | 250/201.2 |
| 2004/0075895 A1 | 4/2004 | Lin | 359/380 |
| 2004/0114117 A1 | 6/2004 | Bleeker | 355/53 |
| 2004/0119954 A1 | 6/2004 | Kawashima et al. | 355/30 |
| 2004/0125351 A1 | 7/2004 | Krautschik | 355/53 |
| 2004/0136494 A1 | 7/2004 | Lof et al. | |
| 2004/0160582 A1 | 8/2004 | Lof et al. | 355/30 |
| 2004/0165159 A1 | 8/2004 | Lof et al. | 355/30 |
| 2004/0207824 A1 | 10/2004 | Lof et al. | |
| 2004/0211920 A1 | 10/2004 | Derksen et al. | 250/492.1 |
| 2004/0239954 A1 | 12/2004 | Bischoff | 356/635 |
| 2004/0263809 A1 | 12/2004 | Nakano | 355/30 |
| 2005/0007569 A1 | 1/2005 | Streefkerk et al. | 355/30 |
| 2005/0007570 A1 | 1/2005 | Streefkerk et al. | 355/30 |
| 2005/0018155 A1 | 1/2005 | Cox et al. | 355/30 |
| 2005/0018208 A1 | 1/2005 | Levinson | 356/517 |
| 2005/0024609 A1 | 2/2005 | De Smit et al. | 355/18 |
| 2005/0030497 A1 | 2/2005 | Nakamura | 355/30 |
| 2005/0036183 A1 | 2/2005 | Yeo et al. | 359/15 |
| 2005/0046813 A1 | 3/2005 | Streefkerk et al. | 355/30 |
| 2005/0046934 A1 | 3/2005 | Ho et al. | 359/380 |
| 2005/0052632 A1 | 3/2005 | Miyajima | 355/53 |
| 2005/0074704 A1 | 4/2005 | Endo et al. | |
| 2005/0094116 A1 | 5/2005 | Flagello et al. | 355/53 |
| 2005/0094125 A1 | 5/2005 | Arai | 355/72 |
| 2005/0122505 A1 | 6/2005 | Miyajima | 355/72 |
| 2005/0132914 A1 | 6/2005 | Mulkens et al. | 101/463.1 |
| 2005/0134817 A1 | 6/2005 | Nakamura | 355/53 |
| 2005/0140948 A1 | 6/2005 | Tokita | 355/30 |
| 2005/0146693 A1 | 7/2005 | Ohsaki | 355/30 |
| 2005/0146694 A1 | 7/2005 | Tokita | 355/30 |
| 2005/0151942 A1 | 7/2005 | Kawashima | 355/30 |
| 2005/0173682 A1 | 8/2005 | Zhang et al. | |
| 2005/0179877 A1 | 8/2005 | Mulkens et al. | 355/30 |
| 2005/0200815 A1 | 9/2005 | Akamatsu | 353/53 |
| 2005/0213065 A1 | 9/2005 | Kitaoka | 355/53 |
| 2005/0213066 A1 | 9/2005 | Sumiyoshi | 355/53 |
| 2005/0219489 A1 | 10/2005 | Nei et al. | 355/53 |
| 2005/0231695 A1 | 10/2005 | Wang et al. | 355/53 |
| 2005/0233081 A1 | 10/2005 | Tokita | 427/256 |
| 2005/0270505 A1 | 12/2005 | Smith | |
| 2006/0038968 A1 | 2/2006 | Kemper et al. | |
| 2006/0050257 A1 | 3/2006 | Honda | 355/67 |
| 2006/0072088 A1 | 4/2006 | Lipson et al. | |
| 2006/0158626 A1 | 7/2006 | Streefkerk et al. | |
| 2006/0158627 A1 | 7/2006 | Kemper et al. | |
| 2007/0046916 A1 | 3/2007 | Sogard | |
| 2007/0084793 A1 | 4/2007 | Wenden | |
| 2007/0188725 A1 | 8/2007 | Sakai | |
| 2008/0062393 A1 * | 3/2008 | Hubertus Mulkens | 355/53 |
| 2008/0106711 A1 | 5/2008 | Beierl et al. | |
| 2008/0129970 A1 | 6/2008 | Furukawa et al. | |
| 2008/0212043 A1 * | 9/2008 | Nagasaka | 355/30 |
| 2009/0021709 A1 | 1/2009 | Nagasaka | |

FOREIGN PATENT DOCUMENTS

| | | | |
|---|---|---|---|
| DE | 224 448 | | 7/1985 |
| DE | 242 880 | | 2/1987 |
| EP | 0023231 | | 2/1981 |
| EP | 0418427 | | 3/1991 |
| EP | 1039511 | | 9/2000 |
| EP | 1 420 300 | A2 | 5/2004 |
| EP | 1 420 300 | A3 | 8/2005 |
| EP | 1 808 884 | A1 | 7/2007 |
| FR | 2474708 | | 7/1981 |
| JP | 58-202448 | | 11/1983 |
| JP | 62-065326 | | 3/1987 |
| JP | 62-121417 | | 6/1987 |
| JP | 63-157419 | | 6/1988 |
| JP | 04-305915 | | 10/1992 |
| JP | 04-305917 | | 10/1992 |
| JP | 06-124873 | | 5/1994 |
| JP | 07-132262 | | 5/1995 |
| JP | 07-220990 | | 8/1995 |
| JP | 10-228661 | | 8/1998 |
| JP | 10-255319 | | 9/1998 |
| JP | 10-303114 | | 11/1998 |
| JP | 10-340846 | | 12/1998 |
| JP | 11-176727 | | 7/1999 |
| JP | 2000-058436 | | 2/2000 |
| JP | 2001-091849 | | 4/2001 |
| JP | 2004-193252 | | 7/2004 |
| JP | 2006140449 | | 6/2006 |
| JP | 2006-190971 | | 7/2006 |
| JP | 2006-191079 | | 7/2006 |
| JP | 2006-203137 | | 8/2006 |
| WO | WO99/49504 | | 9/1999 |
| WO | WO 2004/053596 | A2 | 6/2004 |
| WO | WO 2004/053950 | A1 | 6/2004 |
| WO | WO 2004/053951 | A1 | 6/2004 |
| WO | WO 2004/053952 | A1 | 6/2004 |
| WO | WO 2004/053953 | A1 | 6/2004 |
| WO | WO 2004/053954 | A1 | 6/2004 |
| WO | WO 2004/053955 | A1 | 6/2004 |
| WO | WO 2004/053956 | A1 | 6/2004 |
| WO | WO 2004/053957 | A1 | 6/2004 |
| WO | WO 2004/053958 | A1 | 6/2004 |
| WO | WO 2004/053959 | A1 | 6/2004 |
| WO | WO 2004/055803 | A1 | 7/2004 |
| WO | WO 2004/057589 | A1 | 7/2004 |
| WO | WO 2004/057590 | A1 | 7/2004 |
| WO | WO 2004/090577 | | 10/2004 |
| WO | WO 2004/090633 | | 10/2004 |
| WO | WO 2004/090634 | | 10/2004 |
| WO | WO 2004/092830 | | 10/2004 |
| WO | WO 2004/092833 | | 10/2004 |
| WO | WO 2004/093130 | | 10/2004 |
| WO | WO 2004/093159 | | 10/2004 |
| WO | WO 2004/093160 | | 10/2004 |
| WO | WO 2004/095135 | | 11/2004 |
| WO | WO 2005/010611 | | 2/2005 |
| WO | WO 2005/024517 | | 3/2005 |
| WO | WO 2006041083 A1 * | | 4/2006 |
| WO | WO 2006041086 A1 * | | 4/2006 ............... G03F 7/20 |
| WO | 2006/053751 | | 5/2006 |

OTHER PUBLICATIONS

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths to Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

(56) References Cited

OTHER PUBLICATIONS

S. Owa et al., "Advantage and Feasibility of Immersion Lithography", Proc. SPIE 5040 (2003).

Nikon Precision Europe GmbH, "Investor Relations—Nikon's 2003 Real Solutions", May 15, 2003.

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", Future FAB International, vol. 15, Jul. 11, 2003.

H. Kawata et al., "Fabrication of 0.2 µm Fine Patterns Using Optical Projection Lithography with an Oil Immersion Lens", Jpn. J. Appl. Phys. vol. 31 (1992), pp. 4174-4177.

G. Owen et al., "1/8 µm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International Sematech, Los Angeles, Jan. 27-29, 2004, Slide Nos. 1-51.

H. Hata, "The Development of Immersion Exposure Tools", Litho Forum, International Sematech, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $\kappa_3$ coefficient in nonparaxial λ/NA scaling equations for resolution, depth of focus, and immersion lithography, *J. Microlith., Microfab., Microsyst.* 1(1):7-12 (2002).

Japanese Office Action mailed Sep. 27, 2010 in corresponding Japanese patent application No. 2007-296177.

Translation of Kudo (JP H10-340846).

\* cited by examiner

LITHOGRAPHIC APPARATUS, FLUID COMBINING UNIT AND DEVICE MANUFACTURING METHOD

The present application is a continuation of U.S. patent application Ser. No. 11/603,255, filed on Nov. 22, 2006, now allowed, the entire contents of the foregoing application herein fully incorporated by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. The effect of the liquid allows one to use a projection system with a NA of greater than 1. Other immersion liquids have been proposed, including water with solid particles (e.g. quartz) suspended therein or hydrocarbon fluids.

However, submersing the substrate or substrate and substrate table in a bath of liquid (see, for example, U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

Figure 2:
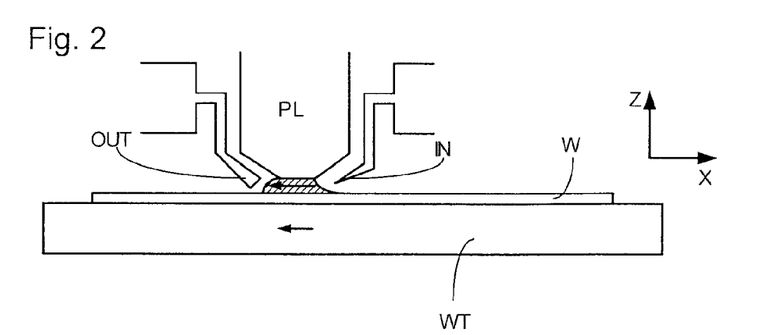
FIGS. 2 and 3 depict a liquid supply system for use in a lithographic projection apparatus.
Figure 3:
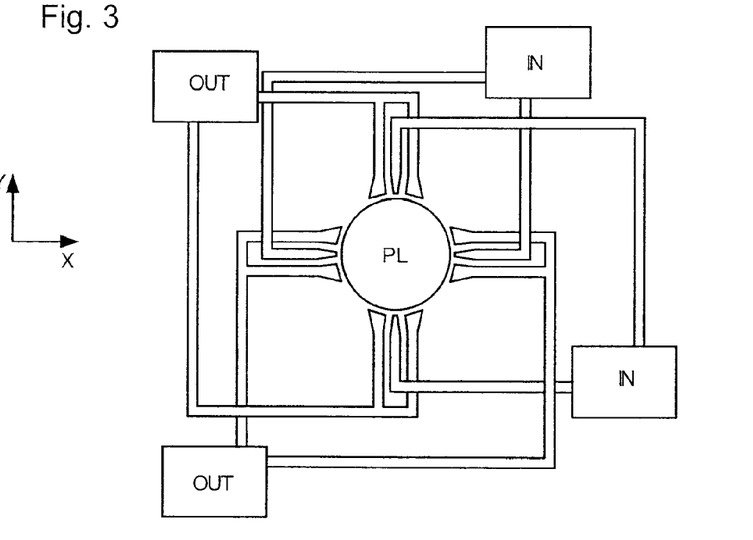

One of the solutions proposed is for a liquid supply system to provide liquid on only a localized area of the substrate and in between the final element of the projection system and the substrate using a liquid supply system (the substrate generally has a larger surface area than the final element of the projection system). One way which has been proposed to arrange for this is disclosed in PCT patent application publication no. WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

Early immersion lithographic machines have used water as the liquid between the final element of the projection system and the substrate. Water has a refractive index of about 1.4 and is relatively inexpensive. The next generation of lithographic immersion apparatus will likely use a liquid with a refractive index higher than that of water. One difficulty with the use of an immersion liquid with a higher refractive index than that of water is that the exact refractive index may vary from manufacturer to manufacturer and/or from batch to batch. This may be a particular problem because the projection system of the lithographic apparatus is designed to be optimized for use at a certain refractive index.

SUMMARY

It is desirable, for example, to provide an immersion lithographic apparatus which is capable of being used with one or more immersion liquids from different sources.

According to an aspect of the invention, there is provided a lithographic apparatus comprising:

a first liquid supply system configured to provide a first liquid with a first refractive index;

a second liquid supply system configured to provide a second liquid with a second refractive index which is lower than the first refractive index; and a combining unit configured to combine the first and second liquids to achieve a combined liquid with a refractive index closer to a desired refractive index than the first refractive index or the second refractive index.

According to an aspect of the invention, there is provided a device manufacturing method comprising:

combining a first liquid with a first refractive index with a second liquid with a second refractive index which is lower than the first refractive index in order to achieve a combined liquid with a refractive index closer to a desired refractive index than the first refractive index or the second refractive index; and projecting a patterned beam of radiation onto a substrate through the combined liquid, which liquid is provided between the substrate and a projection system used to project the patterned beam.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
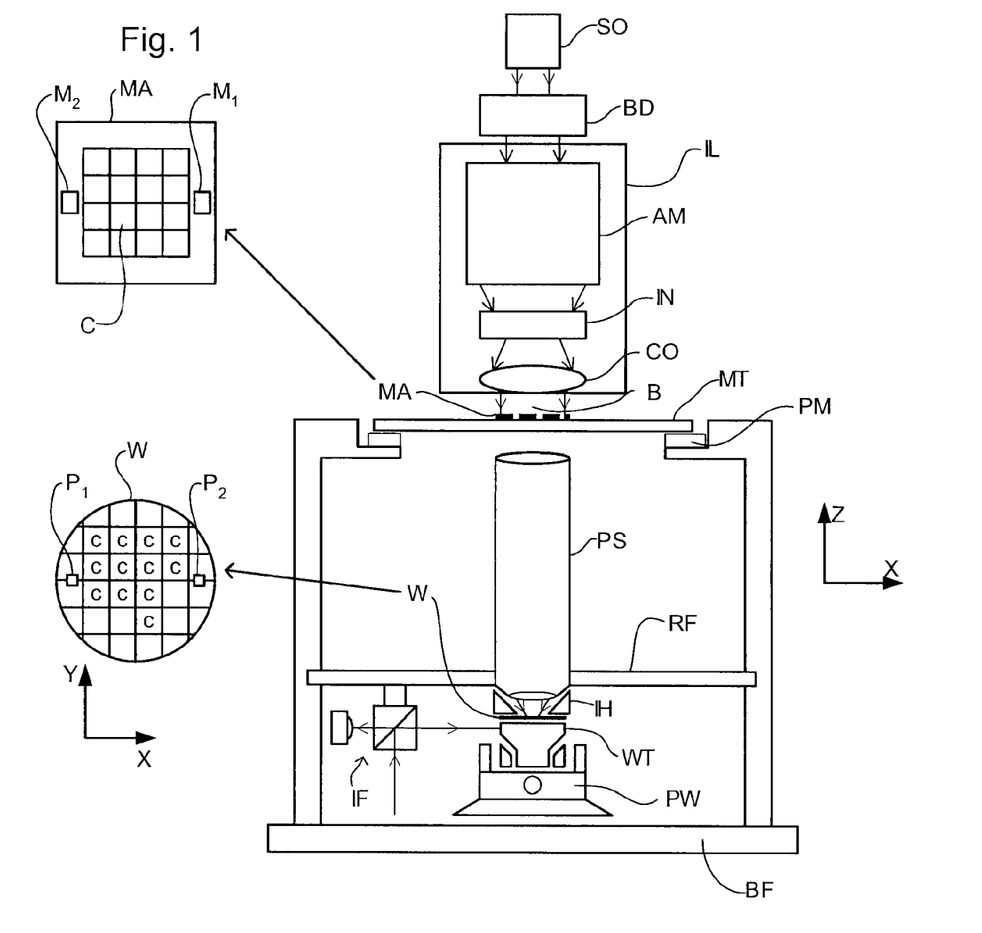
FIG. 1 depicts a lithographic apparatus according to an embodiment of the invention.

FIG. 1 schematically depicts a lithographic apparatus according to one embodiment of the invention. The apparatus comprises:

- an illumination system (illuminator) IL configured to condition a radiation beam B (e.g. UV radiation or DUV radiation);
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PS, held by a frame RF, configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more support structures). In such "multiple stage" machines the additional tables and/or support structures may be used in parallel, or preparatory steps may be carried out on one or more tables and/or support structures while one or more other tables and/or support structures are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in one or more of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 4:
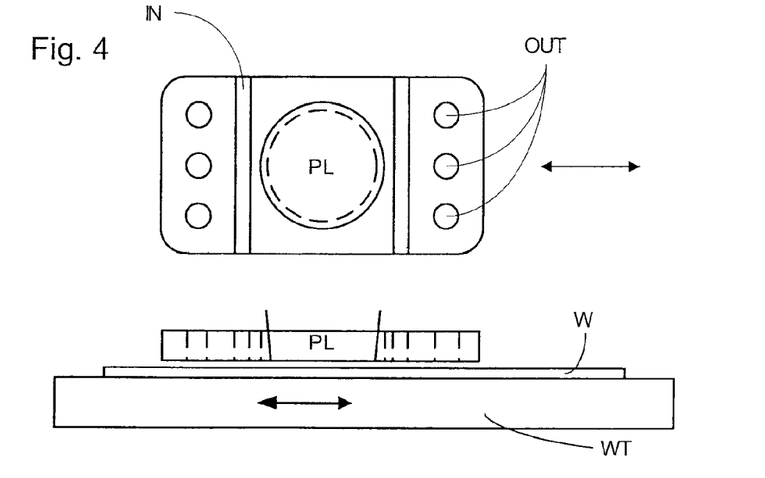
FIG. 4 depicts another liquid supply system for use in a lithographic projection apparatus.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

Figure 5:
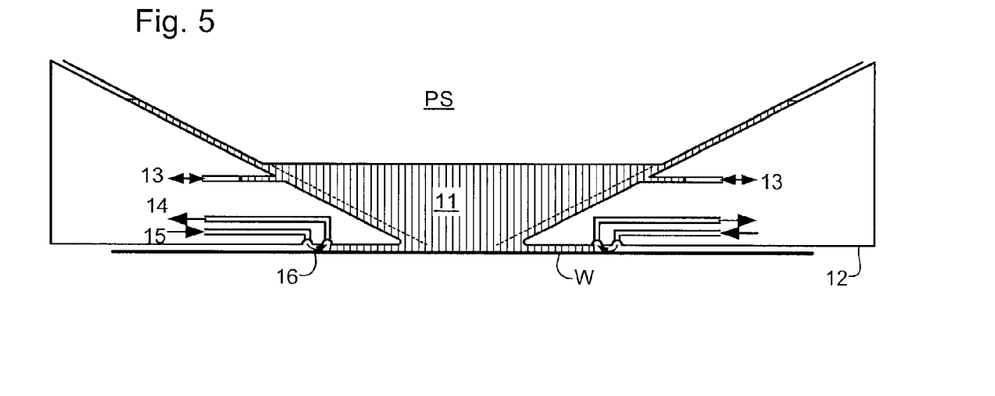
FIG. 5 depicts, in cross-section, a further liquid supply system for use in a lithographic projection apparatus.

Another immersion lithography solution with a localized liquid supply system solution which has been proposed is to provide the liquid supply system with a liquid confinement structure which extends along at least a part of a boundary of the space between the final element of the projection system and the substrate table. Such a solution is illustrated in FIG. 5. The liquid confinement structure is substantially stationary relative to the projection system in the XY plane though there may be some relative movement in the Z direction (in the direction of the optical axis). In an embodiment, a seal is formed between the liquid confinement structure and the surface of the substrate and may be a contactless seal such as a gas seal.

The liquid confinement structure 12 at least partly contains liquid in the space 11 between a final element of the projection system PL and the substrate W. A contactless seal 16 to the substrate may be formed around the image field of the projection system so that liquid is confined within the space between the substrate surface and the final element of the projection system. The space is at least partly formed by the liquid confinement structure 12 positioned below and surrounding the final element of the projection system PL. Liquid is brought into the space below the projection system and within the liquid confinement structure 12 by liquid inlet 13 and may be removed by liquid outlet 13. The liquid confinement structure 12 may extend a little above the final element of the projection system and the liquid level rises above the final element so that a buffer of liquid is provided. The liquid confinement structure 12 has an inner periphery that at the upper end, in an embodiment, closely conforms to the shape of the projection system or the final element thereof and may, e.g., be round. At the bottom, the inner periphery closely conforms to the shape of the image field, e.g., rectangular though this need not be the case.

The liquid is contained in the space 11 by a gas seal 16 which, during use, is formed between the bottom of the liquid confinement structure 12 and the surface of the substrate W. The gas seal is formed by gas, e.g. air or synthetic air but, in an embodiment, $N_2$ or another inert gas, provided under pressure via inlet 15 to the gap between liquid confinement structure 12 and substrate and extracted via outlet 14. The overpressure on the gas inlet 15, vacuum level on the outlet 14 and geometry of the gap are arranged so that there is a high-velocity gas flow inwards that confines the liquid. Those inlets/outlets may be annular grooves which surround the space 11 and the flow of gas 16 is effective to contain the liquid in the space 11. Such a system is disclosed in United States patent application publication no. US 2004-0207824, hereby incorporated in its entirety by reference.

In European patent application publication no. EP 1420300 and United States patent application publication no. US 2004-0136494, each hereby incorporated in their entirety by reference, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

An embodiment of the invention is particularly suited to immersion liquids such as the next generation higher refractive index liquids. These fluids are most likely to be hydrocarbon fluids such as decalin. Candidate fluids include IF131 and IF132 produced by Dupont, HIL-1 and HIL-2 produced by JSR or Delphi produced by Mitsui. Other candidates are mixtures of fluids with nano-particles suspended in them or acids such as phosphoric acids. The difficulty with these high refractive index immersion liquids is that different batches or indeed different (or even the same) types of liquid from various manufacturers can vary in refractive index. This can cause problems because the projection system of a lithographic apparatus is designed for use with an immersion liquid with a specific refractive index. Although it could be possible to place very strict restrictions on the refractive index of the immersion liquid used, it would be desirable if there were several manufacturers from whom high refractive index immersion liquids are available because this would keep the cost down. Also, the index of refraction of a fluid may change under laser irradiation. The ability to shift the index of a fluid by the addition of a second fluid may allow an increase in the lifetime of a fluid.

An embodiment of the invention addresses this problem by including a unit in the apparatus which can adjust the refractive index of the supplied immersion liquid in order to make its refractive index closer to the refractive index for which the projection system of the apparatus has been designed.

Figure 6:
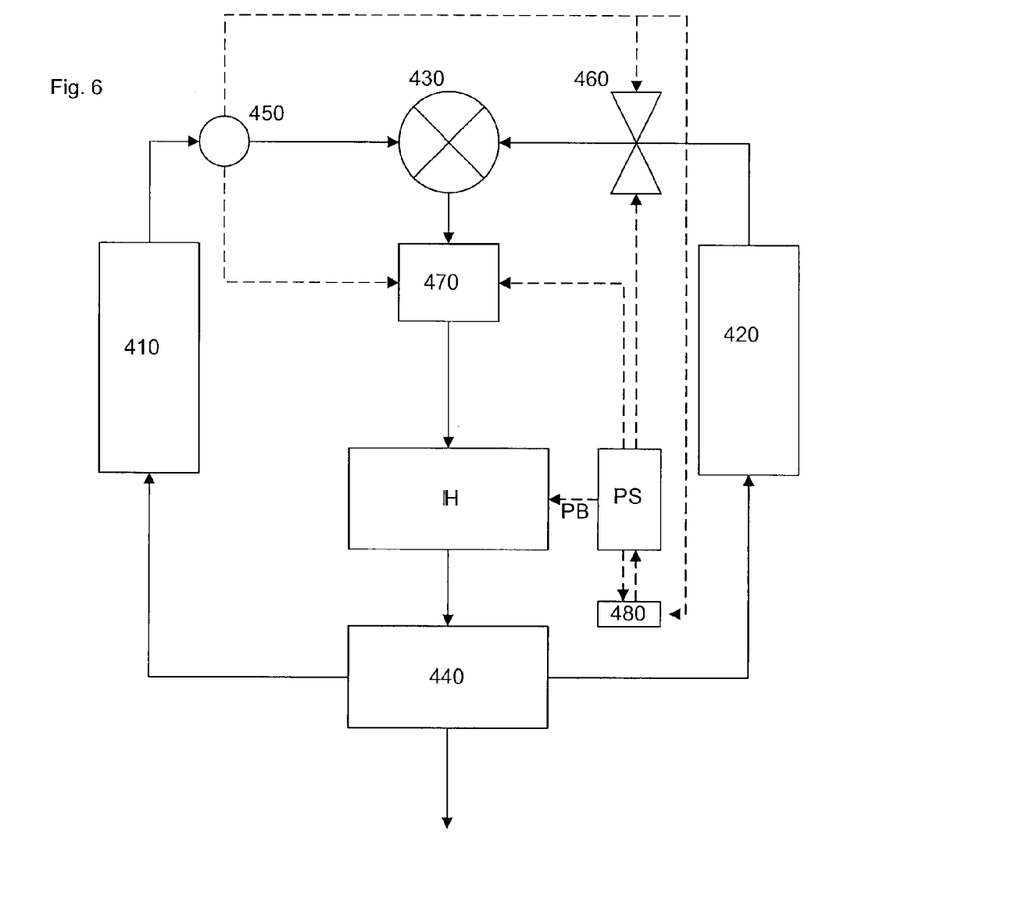
FIG. 6 illustrates schematically an embodiment of the invention.

FIG. 6 illustrates schematically an apparatus according to an embodiment of the invention. Two immersion liquids are supplied. The first immersion liquid is supplied by a first liquid supply system 410. The first immersion liquid has a high refractive index. It is this immersion liquid which can vary in precise refractive index because of variations in refractive index between batches and/or differences in manufacturer or indeed difference in composition.

A second immersion liquid is also provided by a second liquid supply system 420. This second immersion liquid has a refractive index lower than that of the first immersion liquid. Thus, by combining both of the first and second immersion liquids at combining unit 430, a combined immersion liquid can be achieved which has a refractive index lower than that of the first refractive index and higher than that of the second refractive index. The exact refractive index can be calculated from the following equation:

$$x = \frac{d\eta}{(\eta_1 - \eta_2)}$$

where x is the fraction of second immersion liquid, $d\eta$ is the change in refractive index of the first immersion liquid required, $\eta_1$ is the refractive index of the first immersion fluid and $\eta_2$ is the refractive index of the second immersion liquid.

Thus, it can be seen that by combining the first and second immersion liquids in specific proportions it is possible to adjust the refractive index of the combined immersion liquid to be closer to the refractive index for which the projection system PS has been optimized than either the respective first or second refractive indices of the first and second immersion fluids.

The combined immersion liquid is provided to the liquid supply system IH which provides liquid between the projection system PS and the substrate W (and may be of the sort illustrated in, for example, FIG. 2-5 or 7) such that the beam B from the projection system PS passes through the immersion liquid before impinging on the substrate.

The combined immersion liquid may then be provided to a recycling unit 440 which separates the first immersion liquid from the second immersion liquid and provides the separated first immersion liquid back to the first liquid supply system 410 and the separated second immersion liquid to, for example, the second liquid supply system 420. There may also be some waste which is disposed of.

In order to mix correct amounts of first and second immersion liquids, a feedback loop may be used. For example, the refractive index of the first immersion liquid may be measured in real time by a refractive index measuring unit 450 upstream of the combining unit 430. Based on the measurement of refractive index of the first immersion liquid, a valve 460 can be opened or closed such that an appropriate amount of second immersion fluid is provided from the second liquid supply system 420 to the mixing unit 430.

Alternatively or additionally, the refractive index of the combined immersion liquid could be measured downstream of the combining unit 430 and this information be used to adjust the amount of second immersion liquid (or first immersion liquid) provided to the mixing unit 430.

A further feedback loop is possible by using measurements performed by the projection system PS (e.g. results from a transmission image sensor (TIS), an ILIAS sensor, etc.).

It may not be possible to adjust the refractive index of the first immersion liquid by combining it with the second immersion liquid accurately enough for the projection system PS. Two further measures are possible either in combination or individually in order to finally adjust the apparatus. The first of these is a temperature controller 470 which varies the temperature of the combined immersion liquid which has the effect of varying the refractive index. Thus, minor variations in the refractive index of the combined immersion liquid can be made by varying its temperature in order to make the refractive index of the combined immersion liquid even closer or exactly the desired refractive index. The temperature controller 470 can also work in a feedback way with the same or different inputs as the inputs to the combining unit 430 described above. The refractive index of the combined immersion liquid can be measured up or downstream of temperature controller 470.

If the apparatus is not capable of varying the refractive index of the combined immersion liquid accurately enough in order to match the refractive index for which the projection system PS has been optimized, it is possible to account for minor differences between the desired refractive index and the actual refractive index of the combined immersion liquid using one or more Z manipulators 480 of the lithographic apparatus, which manipulator normally moves the vertical position of one or more optical elements of the projection or illumination system (and/or the patterning device or substrate) to adjust aberrations. This method can operate for a maximum $d\eta$ of about 0.002.

In an embodiment, the refractive index of the first immersion liquid should be as close as is possible to the desired refractive index but has a refractive index higher than the desired refractive index. The refractive index of the second immersion liquid should desirably be as low as possible so that only small quantities of the second immersion liquid need to be added to the first immersion liquid (so that as high as possible a desired refractive index is achievable). In an embodiment, the refractive index of the second immersion liquid is lower than 1.4, or less than about 1.3. Thus, for example, if the first refractive index is 1.64 and the desired refractive index is 1.635 and the refractive index of the second immersion fluid is 1.3, the combined immersion liquid will only require 1.47% of the second immersion liquid using the above equation. In an embodiment, there may be an advantage to using two immersion liquids of similar (but different)

refractive index. In this way fine tuning of the refractive index of the combined immersion fluid is easier because the mixing quantities of the first and second immersion fluids are closer to 50/50.

Examples of types of second immersion liquid could be fluorinated hydrocarbons (teflon oil, fomblin-types, Krytox-types, etc.). Such liquids, as is typical of liquids with lower refractive indices, have low radiation absorbance and mix well with high refractive index liquids such as those described above. Alternatives may be (fully) saturated monocyclic hydrocarbons such as cyclohexane or a slightly fluorinated version of decalin.

As will be clear, an embodiment of the invention is equally applicable to the use of more than two liquids, for example three or four liquids could be combined in the appropriate proportions to achieve the desired refractive index.

A typical liquid supply system will be described with reference to FIG. 7 for a better understanding of the embodiments described with respect to FIGS. 8 and 9. It will become clear that, in an immersion lithographic apparatus, immersion liquid which is removed from a space between the projection system PS and the substrate W (where it is at least partly contained by a liquid supply system IH) can be removed through several different paths. Depending upon the path through which the immersion liquid is removed from the space, it may be advantageous to treat that immersion liquid before recycling it back into the space on an individual basis according to the path it has followed. This is because the path it has followed may determine the likely contaminants within it so that liquid purification may be customized to those particular contaminants, for example. As well as immersion liquid being extracted through the liquid supply system (often in the form of a barrier member 12), immersion liquid may also or alternatively be removed through the substrate table WT, in particular by removal of liquid which seeps into a gap between the edge of a substrate W and the substrate table WT.

Figure 7:
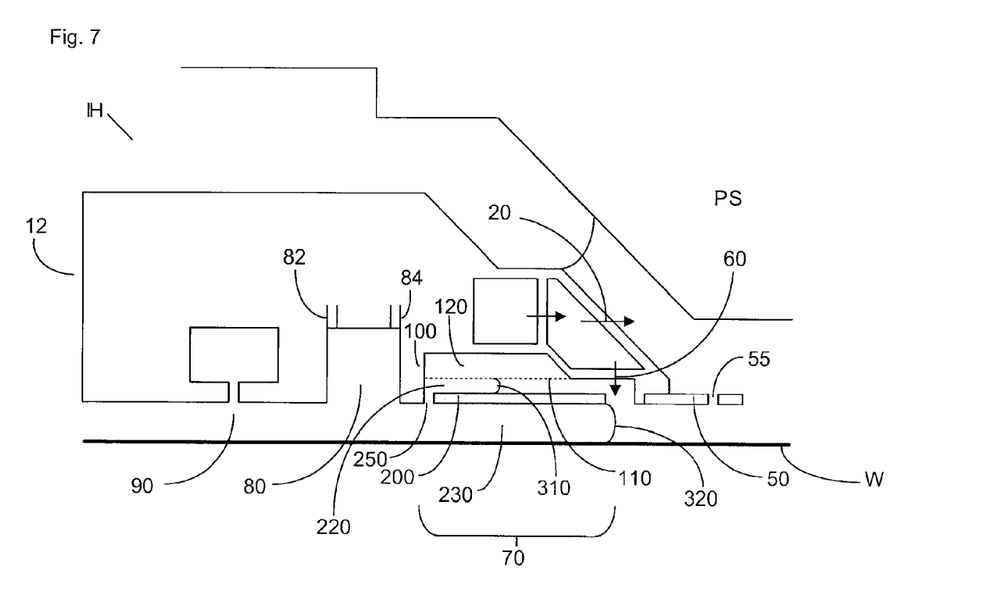
FIG. 7 depicts, in cross-section, a further type of liquid supply system which may be used with an embodiment of the invention.

FIG. 7 illustrates a barrier member 12 which is part of a liquid supply system IH. The barrier member 12 extends around the periphery of the final element of the projection system PS such that the barrier member (which is sometimes called a seal member) is, for example, substantially annular in overall shape.

The function of the barrier member 12 is to at least partly maintain or confine liquid in the space between the projection system PS and the substrate W so that the beam B may pass through the liquid. The top level of liquid is simply contained by the presence of the barrier member 12 and the level of liquid in the space is maintained such that the liquid does not overflow over the top of the barrier member 12. A seal is provided between the bottom of the barrier member 12 and the substrate W. In FIG. 7 the seal is a contactless seal and is made up of several components. Working radially outwardly from the optical axis of the projection system PS, there is provided a (optional) flow control plate 50 which extends into the space (though not into the path of the beam B) which helps maintain parallel flow of the immersion liquid out of inlet 20 across the space and then out through an outlet (not illustrated) opposite and at the same level as the inlet (so that the immersion liquid flows across the space between the final element of the projection system and the substrate). The flow control plate 50 has one or more through holes 55 in it to reduce the resistance to movement in the direction of the optical axis of the barrier member 12 relative to the projection system PS and/or substrate W. Moving radially outwardly along the bottom of the barrier member 12 there is then provided an inlet 60 which provides a flow of liquid in a direction substantially parallel to the optical axis towards the substrate. This flow of liquid is used to help fill any gaps between the edge of the substrate W and the substrate table WT which supports the substrate. If this gap is not filled with liquid, bubbles may be more likely to be included in the liquid in the space between the projection system PS and the substrate W when an edge of the substrate W passes under the barrier member 12. This is undesirable as it can lead to deterioration of the image quality.

Radially outwardly of the inlet 60 is a extractor assembly 70 configured to extract liquid from between the barrier member 12 and the substrate W. The extractor 70 will be described in more detail below and forms part of the contactless seal which is created between the barrier member 12 and the substrate W.

Radially outwardly of the extractor assembly is a recess 80 which is connected through an outlet 82 to the atmosphere and via an inlet 84 to a low pressure source. Radially outwardly the recess 80 is a gas knife 90. An arrangement of the extractor, recess and gas knife is disclosed in detail in United States patent application publication no. US 2006-0158627, incorporated herein its entirety by reference. However, in that document the arrangement of the extractor assembly is different.

The extractor assembly 70 comprises a liquid removal device or extractor or outlet 100 such as the one disclosed in United States patent application publication no. US 2006-0038968, incorporated herein its entirety by reference. Any type of liquid extractor can be used. In an embodiment, the liquid removal device 100 comprises an outlet which is covered in a porous material 110 which is used to separate liquid from gas to enable single-liquid phase liquid extraction. A chamber 120 downstream of the porous material 110 is maintained at a slight under pressure and is filled with liquid. The under pressure in the chamber 120 is such that the meniscuses formed in the holes of the porous material prevent ambient gas (e.g., air) being drawn into the chamber 120 of the liquid removal device 100. However, when the porous material 110 comes into contact with liquid there is no meniscus to restrict flow and the liquid can flow freely into the chamber 120 of the liquid removal device 100. The porous material 110 extends radially inwardly along the barrier member 12 (as well as around the space) and its rate of extraction varies according to how much of the porous material 110 is covered by liquid.

A plate 200 is provided between the liquid removal device 100 and the substrate W so that the function of liquid extraction and the function of meniscus control can be separated from one another and the barrier member 12 can be optimized for each. The plate 200 is a divider or any other element which has the function of splitting the space between the liquid removal device 100 and the substrate W into two channels, an upper channel 220 and a lower channel 230 wherein the upper channel 220 is between the upper surface of the plate 200 and the liquid removal device 100 and the lower channel 230 is between the lower surface of the plate 200 and the substrate W. Each channel is open, at its radially innermost end, to the space.

An under pressure can be applied in the upper channel 220, rather than leaving it open to the atmosphere through, e.g., one or more breathing holes 250. In this way the upper channel 220 can be made wider.

Thus, with the plate 200, there are two meniscuses 310, 320. A first meniscus 310 is positioned above the plate 200 and extends between the porous material 110 and the top surface of the plate 200 and a second meniscus 320 which is positioned underneath the plate 200 and which extends between the plate 200 and the substrate W. In this way, for example, the extractor assembly 70 can be configured for control of the first meniscus for optimum extraction of liquid and for positional control of the second meniscus 320 such that the viscous drag length for the second meniscus 320 is reduced. For example, the characteristics, in particular of the plate 200, may be optimized to make it energetically favorable for the meniscus 320 to remain adhered to the plate 200 such that the scan speed of the substrate W beneath the barrier member 10 can be increased. Capillary forces acting on the second meniscus 320 are outwards and are balanced by an under pressure in the liquid adjacent the meniscus so that the meniscus stays still. Higher loading on the meniscus, for example by viscous drag and inertia, results in a lowering of the contact angle of the meniscus with the surface.

As noted above, one or more breathing holes 250 may be provided at the radially outward most end of the plate 200 such that the first meniscus 310 is free to move inwardly and outwardly beneath the porous material 110 so that the extraction rate of the liquid removal device 100 can vary according to how much of the porous material 110 is covered by liquid. As illustrated in FIG. 7 the second meniscus 320 is adhered to a lower innermost edge of the plate 200. In FIG. 7, the innermost lower edge of the plate 200 is provided with a sharp edge so as to pin the second meniscus 320 in place.

Although not specifically illustrated in FIG. 7, the liquid supply system has a mechanism to deal with variations in the level of the liquid. This is so that liquid which builds up between the projection system PS and the barrier member 12 can be dealt with and does not spill. Such a build-up of liquid might occur during relative movement of the barrier member 12 to a projection system PS described below. One way of dealing with this liquid is to provide the barrier member 12 so that it is very large so that there is hardly any pressure gradient over the periphery of the barrier member 12 during movement of the barrier member 12 relative to the projection system PS. In an alternative or additional arrangement, liquid may be removed from the top of the barrier member 12 using, for example, an extractor such as a single phase extractor similar to the extractor 110.

That said, it should be noted that one or more embodiments of the invention is applicable to any type of liquid supply system IH.

It can be seen from the description of FIG. 7 that there are several ways in which immersion liquid is removed from the space between the final element of the projection system and the substrate. These include immersion liquid which flows across the space out of inlet 20 and into an outlet opposite the inlet 20 (the outlet is not illustrated). This immersion liquid may or may not be irradiated depending upon when the beam B is activated. Immersion liquid is removed by the extractor 70 and this immersion liquid is likely to be extracted as a single phase. Other immersion liquid which escapes the extractor 70 could be collected by the recess 80 and gas (or fluid-inert gas) knife 90 combination. Any such immersion liquid extracted is likely to be a combination of liquid and gas. Finally, liquid is also likely to be removed from the space through the substrate table WT from between the edge of the substrate W and the substrate table WT. This is also likely to have a high amount of gas. Liquid which has been in contact with a top surface of the substrate (i.e. the resist) may also be contaminated by leaching so that liquid may be best treated in a particular way different to other liquid, as described below.

It is possible to treat at least two of the sources of immersion liquid separately in a recycling path or circuit and two embodiments are described. It will be seen that the principles of an embodiment of the invention can be applied in a recycling system. Different sources have different levels of contamination and the more contamination, the more difficult and expensive recycling becomes.

In the below embodiments, the liquid supply system is assumed to have three main types of liquid removed. These are single phase immersion liquid which has been in contact with the liquid supply system and which may or may not have been irradiated; two phase immersion liquid which has been in contact with the liquid supply system (i.e. immersion liquid extracted by a gas knife extractor); and immersion liquid which has been in contact with the substrate table WT and is likely to be two phase. In the Figures these flows are labeled 1006, 1004 and 1002 respectively.

Figure 8:
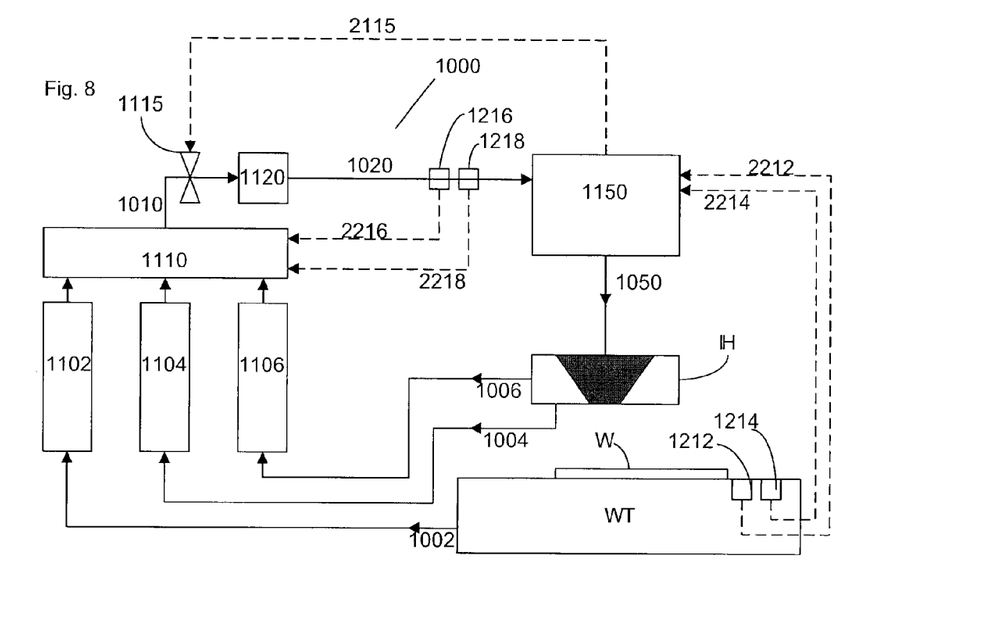
FIG. 8 illustrates schematically a further embodiment of the invention.

In an embodiment, referring to FIG. 8, the liquid supply system IH is illustrated schematically as is the substrate table WT on which the substrate W is supported. The solid arrows show the various flow paths of immersion liquid in the liquid circuit 1000. As can be seen, liquid is prepared in a liquid preparation module 1150 and supplied through line 1050 to the liquid supply system IH. The liquid supply system IH fills the space between the projection system PS and the substrate W with the liquid.

In this and other embodiments, three types of immersion liquid are shown as being removed from that space though there may be less or more than three. The three types of liquid are the liquid 1002 which is extracted from the space through the substrate table WT, the liquid 1004 which is extracted from the space through, e.g., a gas knife extractor and the liquid 1006 which is extracted through, e.g., an outlet in the side of the barrier member 12. Each of these types of liquid has its own parallel liquid treatment units 1102, 1104, 1106 in the recycling system. The parallel liquid treatment units 1102, 1104, 1106 are optimized to treat the respective flow of immersion liquid for the types of contaminants likely to be present.

Thus, the parallel liquid treatment unit 1102, which treats the immersion liquid 1002 from the substrate table WT, has a degassing unit to degas the immersion liquid which passes through it, and has a purifier to purify the immersion liquid. The purifier will be optimized to purify immersion liquid which has come into contact with the substrate table WT. The parallel liquid treatment unit 1102 also has one or more particle filters which are optimized to extract particles likely to have contaminated the immersion liquid in the substrate table WT. In the parallel liquid treatment units, the particle filter(s) is for fairly coarse particles.

Equally the parallel liquid treatment unit 1104 for the liquid 1004, which exits through, for example, the gas knife extractor of the liquid supply system, has a degassing unit, a purifier and one or more particle filters. The purifier and one or more particle filters of the parallel liquid treatment unit 1104 will be optimized for immersion liquid which has been in contact with the liquid supply system IH (e.g., barrier member 12). The unit 1104 will be optimized to remove particles and purify immersion liquid which has been acted on by, for example, a gas knife which may result in its own particular type of impurities and particles.

As will be appreciated, the liquid 1002 may also have been in contact with the liquid supply system IH and the liquid 1004 may have been in contact with the top surface of the substrate table WT.

Finally, the liquid 1006, which has simply passed across the space and is therefore likely to be removed from the space as a single phase, will be treated by the liquid treatment unit 1106 which may not comprise a degassing unit (because there will likely be no gas in the liquid because there would have been no opportunity for gas to be introduced into that liquid)

but will comprise a purifier and one or more particle filters optimized to remove particles which are likely to exist in the liquid supply system.

The three flows are illustrative only. There may be other flows, for example a single phase flow extracted through an extractor between the liquid supply system IH and the substrate W, such as extractor 70.

The flows of liquid out of the parallel liquid treatment units 1102, 1104, 1106 are combined by a fluid cycling integrator 1110 and supplied further as flow 1010 to a container or buffer 1120 where the liquid is stored until it is used by the fluid preparation unit 1150. The fluid preparation unit 1150 may itself comprise several units to treat the liquid prior to it being supplied to the liquid supply system IH. The fluid preparation unit 1150 can be seen as a serial liquid treatment unit in that all of the recycled immersion liquid will pass through it from the container 1120 via flow 1020. The fluid preparation unit 1150 could contain a degassing unit, a temperature control unit, a flow control unit and a refractive index control unit. In the embodiment illustrated in FIG. 8, the fluid preparation unit 1150 has a fine particle filter unit for final filtration after the one or more coarse filters of the parallel liquid treatment units 1102, 1104, 1106. Of course any of these parts of the fluid preparation unit 1150 could be positioned separately in the flow paths 1010 or 1020.

Also a particle counter could be present in the fluid preparation unit (or elsewhere in the circuit) which detects the number and/or size of any particulate impurities in the immersion liquid. The system could be arranged such that if more than a desired number or greater than a desired size of particles is detected, the immersion liquid is automatically routed via a particle filter, either a separate particle filter or one which is part of another component such as a liquid treatment unit 1102, 1104, 1106. This additional aspect is applicable to any of the described embodiments.

Elements of the fluid preparation unit 1150 can be controlled in a feed-back manner based on measurements taken at the substrate table WT using sensors 1212 and 1214. Sensor 1212 could, for example, be a wavefront sensor and sensor 1214 could be an intensity (absorption) sensor. Based on the measurement results of these sensors, the fluid preparation unit 1150 and the rest of the lithographic apparatus could be controlled to achieve the correct wavefront position and dose. This is achieved through control signals 2212 and 2214. The final preparation unit 1150 could vary how the immersion fluid is prepared prior to entering the liquid supply system IH and thereby control the refractive index (e.g. by temperature variation). One or both of those sensors could also be used in determining when it is necessary to renew the immersion liquid in the circuit 1000. Obviously it is desirable to ensure that the absorption remains below a pre-determined maximum acceptable level and that the refractive index remains stable and if not that the refractive index is known so that the necessary optical corrections can be made. Alternatively or additionally, there could be a regular program in place for the periodical replacement of liquid in the circuit 1000.

Parts of the circuit 1000 could be supplied with the main bulk of the immersion lithographic apparatus and other parts, in particular the parallel treatment units, could be provided as a separate unit from the bulk of the immersion lithographic apparatus.

The apparatus of this and other embodiments may be part of a closed system or a partially closed system. This is in contrast to an open system in which immersion liquid which is removed from the lithographic apparatus is either disposed or is re-worked offline and later re-supplied to the lithographic apparatus. In a closed system the liquid in the apparatus is continually recycled and the liquid is not replenished in use with fresh liquid. It may be necessary to include two paths through which the fluid may be recycled in a closed system (as well as in a partially closed system) in case for some reason a part of the recycling system becomes inoperative. Thus, effectively there would be one or more valves to divert the liquid from, for example, one or more of the liquid treatment units 1102, 1104, 1106, fluid cycling integrator 1110, container 1120 and fluid preparation unit 1150 to a separate circuit comprising the same components. The valve(s) may be part of one or more of those devices or in the flow path before or after one or more of those devices as appropriate. In a partially closed system, fresh liquid can be added (for example to the container 1120 during operation of the recycling system). Liquid exiting the liquid supply system IH or substrate table WT could be diverted to be disposed of or to be re-worked offline prior to being re-supplied to the container 1120. Using this system new immersion liquid can be added into the circuit 1000 without interruption of the flow of immersion liquid so that new immersion liquid can be added without any downtime of the whole apparatus.

In an embodiment, the apparatus has a further control signal 2115 from the fluid preparation unit 1150 to a pressure control unit 1115. This ensures that the fluid preparation unit 1150 receives immersion liquid at the correct rate. This arrangement is particularly useful if the fluid recycling integrator 1110 and the parallel treatment units 1102, 1104, 1106 are part of a separate machine to the remainder of the circuit 1000.

Furthermore, two sensors 1216, 1218 are provided in the path 1020 from the container 1120 to the fluid preparation unit 1150. These sensors measure the refractive index of the immersion liquid directly and/or the absorption of the immersion liquid.

The outputs of the sensors 2216, 2218 are provided to the fluid recycling integrator (and/or one or more of the parallel treatment units 1102, 1104, 1106) so that any necessary adjustment can be made directly to reach the desired refractive index and/or absorption of the immersion liquid entering the fluid preparation unit 1150. This extra control prior to entry of the immersion liquid into the fluid preparation unit 1150 may result in increased control of the properties of the immersion liquid entering the liquid supply system IH.

Thus, it can be seen that parallel treatment units 1102, 1104, 1106 can be seen as liquid supply devices providing liquids with different refractive indices. Thus, the feedback 2216, 2218 from the sensors 1216, 1218 can be seen to provide feedback to the fluid recycling integrator 1110 such that a desired refractive index is achieved. The fluid preparation unit 1150 can vary the temperature of the immersion liquid, for example based on the output of sensors 1212 and 1214 which are sensors associated with the projection system. Therefore, the embodiment of FIG. 8, despite appearing different to the embodiment of FIG. 6, works on the same principle.

Figure 9:
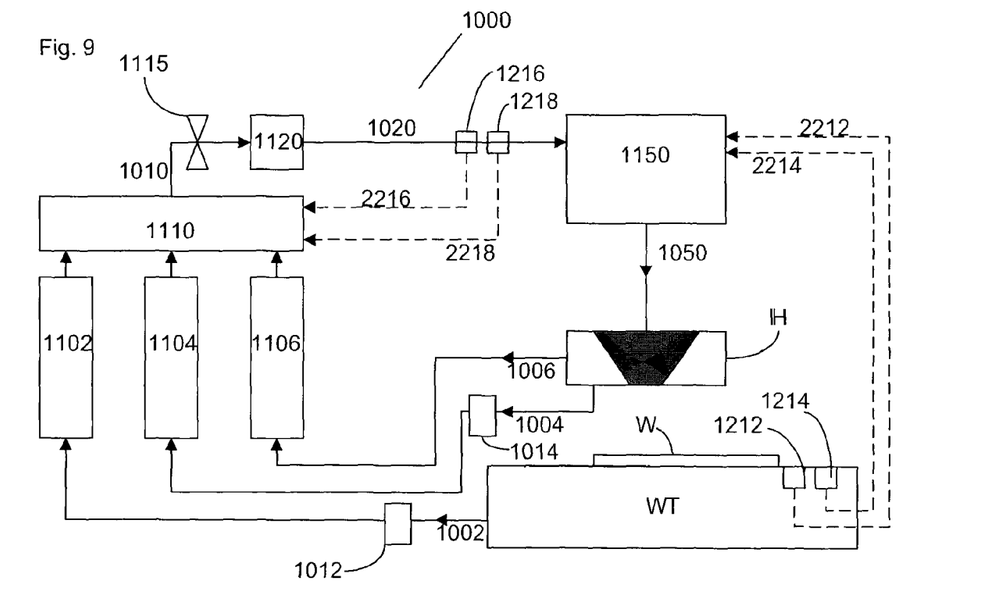
FIG. 9 illustrates schematically another embodiment of the invention.

Referring to FIG. 9, another embodiment is depicted that is the same as the embodiment described with respect to FIG. 8 except as described below.

In order to ease splitting of the parallel treatment units 1102, 1104, 1106 from the remainder of the lithographic apparatus, in this embodiment the parallel treatment units 1102, 1104, used to treat immersion liquid which may have had gas incorporated in it, do not have degassing units. Instead, separate degassing units 1014, 1012 are provided in the immersion liquid paths 1002, 1004 prior to those immersion liquid paths reaching their respective parallel treatment units 1102, 1104. In this way the degassing units, which can be quite complicated, can be formed as part of the lithographic apparatus thereby easing the splitting up of the unit into two parts.

In an embodiment, there is provided a lithographic apparatus comprising: a first liquid supply system configured to provide a first liquid with a first refractive index; a second liquid supply system configured to provide a second liquid with a second refractive index which is lower than the first refractive index; and a combining unit configured to combine the first and second liquids to achieve a combined liquid with a refractive index closer to a desired refractive index than the first refractive index or the second refractive index.

In an embodiment, the lithographic apparatus further comprises a projection system configured to project a patterned radiation beam onto a target portion of a substrate; and a liquid supply system configured to provide the combined liquid to a space between the projection system and a substrate. In an embodiment, the combining unit is configured to use feedback in order to determine quantities of the first and second liquids to achieve the desired refractive index. In an embodiment, the feedback is based on a measurement of the refractive index of the first liquid. In an embodiment, the feedback is based on a measurement of the refractive index of the combined liquid. In an embodiment, the feedback is based on measurements taken by a sensor of a projection system of the apparatus. In an embodiment, the combined liquid comprises 10% or less of the second liquid. In an embodiment, the combined liquid comprises between 30 and 70% of the first liquid. In an embodiment, the lithographic apparatus further comprises a Z controller configured to control a Z manipulator of a projection system to compensate for any difference between the refractive index of the combined liquid and the desired refractive index, the projection system configured to project a patterned beam onto a target portion of a substrate. In an embodiment, the combining unit is configured to achieve a combined liquid with a refractive index within 0.002 of the desired refractive index. In an embodiment, the second liquid comprises one or more selected from the group: fluorinated hydrocarbon, fomblin, Krytox type oil, decalin, saturated monocyclic hydrocarbon, cyclohexane, fluorinated decalin or other hydrocarbon. In an embodiment, the lithographic apparatus further comprises a temperature controller configured to vary a temperature of the combined liquid to change the refractive index of the combined liquid towards the desired refractive index. In an embodiment, the lithographic apparatus further comprises a fluid recycling system configured to separate the first and second liquids from the combined liquid after use and to return first liquid to the first liquid supply system. In an embodiment, the first refractive index is closer to the desired refractive index than the second refractive index. In an embodiment, the lithographic apparatus further comprises a liquid conditioner configured to condition the combined liquid to vary its refractive index.

In an embodiment, there is provided a device manufacturing method comprising: combining a first liquid with a first refractive index with a second liquid with a second refractive index which is lower than the first refractive index in order to achieve a combined liquid with a refractive index closer to a desired refractive index than the first refractive index or the second refractive index; and projecting a patterned beam of radiation onto a substrate through the combined liquid, which liquid is provided between the substrate and a projection system used to project the patterned beam.

In an embodiment, the method further comprises measuring the refractive index of (i) the first liquid, or (ii) of the second liquid, or (iii) of the combined liquid, or (iv) of any combination of (i)-(iii), and varying the fraction of the first liquid combined with the second liquid to more closely achieve the desired refractive index. In an embodiment, the measuring includes measuring the refractive index of the combined liquid. In an embodiment, the measuring is performed by a sensor of the projection system. In an embodiment, the method further comprises using a Z manipulator of the projection system to compensate for any difference between the refractive index of the combined liquid and the desired refractive index.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm). The term "lens", where the context allows, may refer to any one or combination of various types of optical components, including refractive and reflective optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

One or more embodiments of the invention may be applied to any immersion lithography apparatus, in particular, but not exclusively, those types mentioned above and whether the immersion liquid is provided in the form of a bath or only on a localized surface area of the substrate. A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The immersion liquid used in the apparatus may have different compositions, according to the desired properties and the wavelength of exposure radiation used. For an exposure wavelength of 193 nm, ultra pure water or water-based compositions may be used and for this reason the immersion liquid is sometimes referred to as water and water-related terms such as hydrophilic, hydrophobic, humidity, etc. may be used.

One or more features or aspects of one or more embodiments herein may be used in combination with or substituted for one or more features or aspects of one or more other embodiments herein.

The descriptions above are intended to be illustrative, not limiting. Thus, it will be apparent to one skilled in the art that modifications may be made to the invention as described without departing from the scope of the claims set out below.

The invention claimed is:

1. A lithographic apparatus comprising:
   a projection system configured to project a patterned radiation beam onto a target portion of a substrate;
   a movable table, located below the projection system, comprising a sensor having a detector in or on the movable table;
   a first liquid supply system configured to provide a first liquid with a first refractive index;
   a second liquid supply system configured to provide a second liquid with a second refractive index which is lower than the first refractive index;
   a combining unit configured to combine the first and second liquids to achieve a combined liquid with a refractive index closer to a desired refractive index than the first refractive index or the second refractive index;
   a refractive index measuring unit, separate from the sensor, to measure refractive index of (i) the first liquid, or (ii) the second liquid, or (iii) the combined liquid, or (iv) any combination selected from (i)-(iii); and
   a fluid recycling system configured to separate the first and second liquids from the combined liquid after use and to return first liquid to the first liquid supply system,
   wherein the combining unit is configured to combine the first and second liquids based on a measurement by the sensor of the movable table and a measurement by the refractive index measuring unit.

2. The lithographic apparatus of claim 1, further comprising a liquid supply system configured to provide the combined liquid to a space between the projection system and the substrate.

3. The lithographic apparatus of claim 1, wherein the combining unit is configured to use feedback in order to determine quantities of the first and second liguids to achieve the desired refractive index.

4. The lithographic apparatus of claim 1, wherein the combined liquid comprises 10% or less of the second liquid.

5. The lithographic apparatus of claim 1, wherein the combined liquid comprises between 30 and 70% of the first liquid.

6. The lithographic apparatus of claim 1, further comprising a Z controller configured to control a Z manipulator of the projection system to compensate for any difference between the refractive index of the combined liquid and the desired refractive index.

7. The lithographic apparatus of claim 1, wherein the combining unit is configured to achieve a combined liquid with a refractive index within 0.002 of the desired refractive index.

8. The lithographic apparatus of claim 1, wherein the second liquid comprises one or more selected from the group: a hydrocarbon, fomblin, Krytox type oil or fluorinated decalin.

9. The lithographic apparatus of claim 1, further comprising a temperature controller configured to vary a temperature of the combined liquid to change the refractive index of the combined liquid towards the desired refractive index.

10. The lithographic apparatus of claim 1, wherein the first refractive index is closer to the desired refractive index than the second refractive index.

11. The lithographic apparatus of claim 1, further comprising a liquid conditioner configured to condition the combined liquid to vary its refractive index.

12. The lithographic apparatus of claim 1, wherein the sensor is further configured to measure an optical property of the projection system.

13. A device manufacturing method comprising:
   taking a measurement using a sensor detector in or on a movable table, the movable table located below a projection system configured to project a patterned radiation beam onto a target portion of a substrate;
   combining a first liquid with a first refractive index with a second liquid with a second refractive index which is lower than the first refractive index in order to achieve a combined liquid with a refractive index closer to a desired refractive index than the first refractive index or the second refractive index;
   taking a measurement, using a refractive index measuring unit separate from the sensor detector, of refractive index of (i) the first liquid, or (ii) the second liquid, or (iii) the combined liquid, or (iv) any combination selected from (i)-(iii), wherein the combining comprises combining the first and second liquids based on the measurement by the sensor detector and the measurement by the refractive index measuring unit; and
   projecting the patterned beam of radiation onto the substrate through the combined liquid, which liquid is between the substrate and the projection system; and
   separating the first and second liquids from the combined liquid after use and returning first liquid to a supply system of the first liquid.

14. The method of claim 13, further comprising using a Z manipulator of the projection system to compensate for any difference between the refractive index of the combined liquid and the desired refractive index.

15. The method of claim 13, further comprising measuring an optical property of the projection system using the sensor.

16. A lithographic apparatus comprising:
   a projection system configured to project a patterned radiation beam onto a target portion of a substrate;
   a liquid supply system configured to provide a liquid to a space between the projection system and the substrate;
   a first liquid treatment system configured to receive liquid from the space and treat the liquid from the space to provide a first liquid with a first refractive index greater than a desired refractive index;
   a second liquid treatment system, separate from the first liquid treatment system, configured to receive further liquid from the space and treat the further liquid from the space to provide a second liquid with a second refractive index which is lower than the first refractive index; and
   a combining unit configured to combine the first and second liquids to achieve a combined liquid with a refractive index closer to the desired refractive index than the first refractive index or the second refractive index and provide the combined liquid to the liquid supply system for supply to the space.

17. The lithographic apparatus of claim 16, wherein the liquid provided to the space, the first liquid, the second liquid and the combined liquid comprise the same liquid material.

18. The lithographic apparatus of claim 16, wherein each of the first and second liquid treatment systems comprises a filter and the first liquid treatment system, the second liquid treatment system or the combining unit comprises a degasser.

19. A lithographic apparatus comprising:
- a projection system configured to project a patterned radiation beam onto a target portion of a substrate;
- a movable table, located below the projection system, comprising a sensor having a detector in or on the movable table;
- a first liquid supply system configured to provide a first liquid with a first refractive index;
- a second liquid supply system configured to provide a second liquid with a second refractive index which is lower than the first refractive index;
- a combining unit configured to combine the first and second liquids to achieve a combined liquid with a refractive index closer to a desired refractive index than the first refractive index or the second refractive index, based on a measurement by the sensor;
- a control unit configured to cause the sensor to measure a property of radiation emitting from the projection system; and
- a fluid recycling system configured to separate the first and second liquids from the combined liquid after use and to return first liquid to the first liquid supply system.

* * * * *